United States Patent
Chua et al.

(10) Patent No.: US 7,184,111 B2
(45) Date of Patent: Feb. 27, 2007

(54) PHOSPHOR FOR USE IN WHITE SEMICONDUCTOR LIGHT SOURCES AND A WHITE LIGHT SOURCE UTILIZING THE SAME

(75) Inventors: Janet Bee Yin Chua, Air Itam (MY); Kee Yean Ng, Taman Inderawasih (MY); Tong Fatt Chew, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/425,860

(22) Filed: Apr. 28, 2003

(65) Prior Publication Data
US 2004/0212295 A1    Oct. 28, 2004

(51) Int. Cl.
G02F 1/1333    (2006.01)

(52) U.S. Cl. .............. 349/71; 349/69; 349/70; 313/503; 362/231; 362/800

(58) Field of Classification Search ........... 349/69–71, 349/50, 61, 62; 313/498, 503, 501, 502, 313/504, 506; 362/34, 555, 231, 800
See application file for complete search history.

(56) References Cited

U.S. PATENT DOCUMENTS

| | | | |
|---|---|---|---|
| 6,252,254 B1 * | 6/2001 | Soules et al. | 257/89 |
| 6,596,195 B2 * | 7/2003 | Srivastava et al. | 252/301.4 R |
| 6,720,584 B2 * | 4/2004 | Hata et al. | 257/98 |
| 2003/0078156 A1 * | 4/2003 | Lowden et al. | |

* cited by examiner

Primary Examiner—Dung T. Nguyen
Assistant Examiner—Thoi V. Duong

(57) ABSTRACT

A light source having an LED that is covered by a layer containing a phosphor is disclosed. The LED emits light in a first wavelength band. The phosphor containing layer includes particles that contain a phosphor having the formula $Dy_3A_5O_{12}$, where A is at least one of the elements aluminum, gallium, indium, magnesium or silicon. The layer is positioned to receive a portion of the light from the LED and convert the light to light in a second wavelength band. The phosphor may be doped with Ce, Eu, and Tb, or a combination thereof.

16 Claims, 1 Drawing Sheet

(12)	United States Patent
US 7,184,111 B2

PHOSPHOR FOR USE IN WHITE SEMICONDUCTOR LIGHT SOURCES AND A WHITE LIGHT SOURCE UTILIZING THE SAME

FIELD OF THE INVENTION

The present invention relates to light emitting diodes and laser diodes.

BACKGROUND OF THE INVENTION

Semiconductor light emitters include light emitting diodes (LEDs) and laser diodes. LEDs have many advantages over incandescent and fluorescent light sources. LEDs have a relatively small size, low power consumption for a given light output, and a longer lifetime. In addition, LEDs have been attractive candidates for applications in which a colored light source is needed, since LEDs emit light in a relatively narrow band of wavelengths. However, the lack of an inexpensive LED to replace white light sources has hampered the movement of LEDs into these applications.

A semiconductor-based light source that emits light that is perceived by a human observer to be "white" can be constructed by providing a source that emits a combination of blue and yellow light in the proper intensity ratio. For example, high intensity blue-emitting LEDs are known to the art. Yellow light can be generated from the blue light by converting some of the blue photons via an appropriate phosphor. In one design, a transparent layer containing dispersed particles of the phosphor covers an LED chip. The phosphor particles are dispersed in a potting material that surrounds the light-emitting surfaces of the blue LED. A portion of the light leaving the LED is converted to yellow by the phosphor particles. The cost of the phosphors used to convert the blue light to yellow light represents a significant fraction of the cost of the device.

In addition, the phosphor utilized for the wavelength conversion ages over the lifetime of the light source. This aging results in a decrease in the efficiency with which the activation light is converted. Hence, the ratio of blue to yellow light changes over the lifetime of the device as the phosphor ages. This leads to an undesirable color shift in the light source.

White light sources based on UV emitting semiconductor devices are also known in the art. In these devices, the light emitter is covered with a layer having two phosphors, one that generates blue light and one that generates yellow light. Once again, to be perceived as a white light source, the phosphors must be present in a specific ratio. Unfortunately, the phosphors used in these prior art devices age at different rates. Hence, these light sources exhibit the same type of undesirable color shift as the one phosphor devices.

SUMMARY OF THE INVENTION

The present invention includes a light source having a semiconductor light emitting device such as an LED or laser diode that is covered by a layer containing a phosphor. The LED emits light in a first wavelength band. The phosphor containing layer includes particles that contain a phosphor having the formula $Dy_3A_5O_{12}$, where A is at least one of the elements aluminum, gallium, indium, magnesium or silicon. The layer is positioned to receive a portion of the light from the light emitting device and convert the light to light in a second wavelength band. The phosphor may be doped with Cerium, Europium, or Terbium or a combination thereof.

DETAILED DESCRIPTION OF THE PREFERRED EMBODIMENTS OF THE INVENTION

Figure 1:
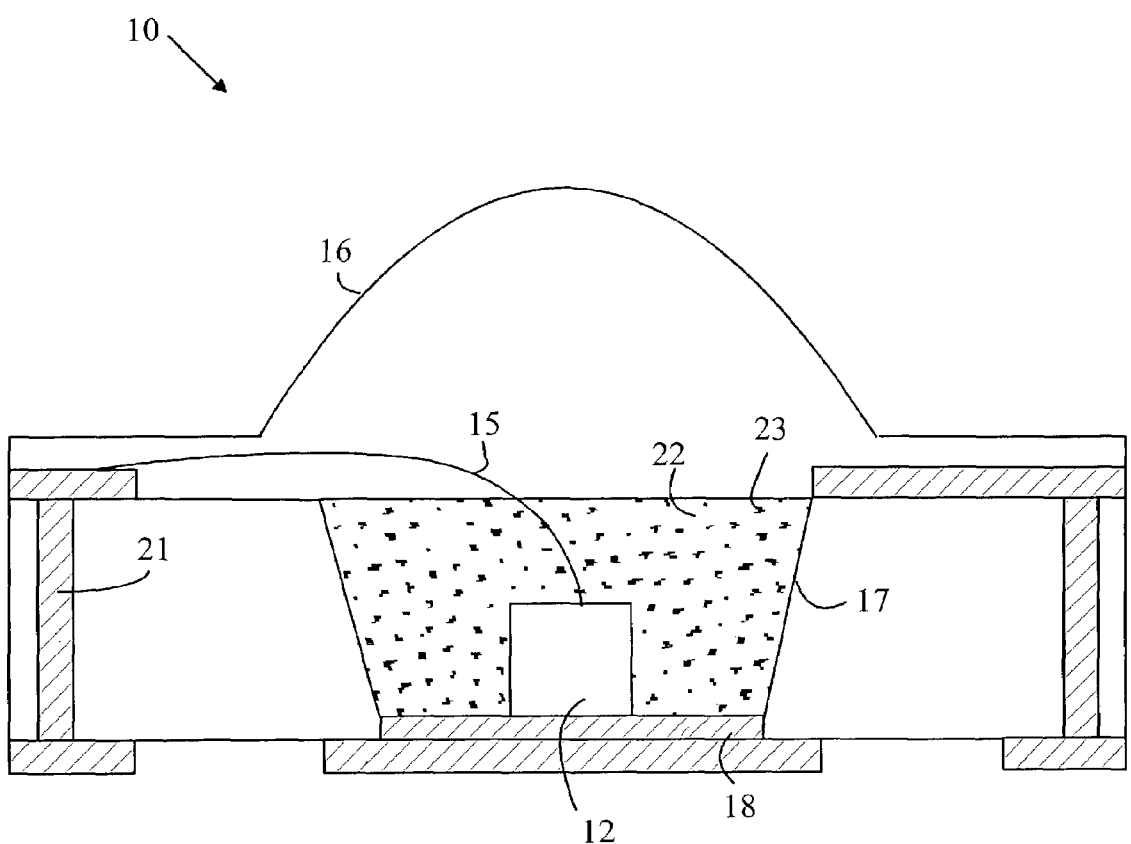
FIG. 1 is a cross-sectional view of a white light LED.

The manner in which a white light LED according to the present invention is constructed can be more easily understood with reference to FIG. 1, which is a cross-sectional view of a completed white-emitting light source 10 according to one embodiment of the present invention. Light source 10 includes a reflecting cup 17 constructed in a well in a printed circuit board base. Semiconductor chip 12 is mounted on a heat sink 18 that covers the bottom of cup 17. Cup 17 is filled with a casting epoxy 22 in which the phosphor particles 23 are suspended.

If semiconductor chip 12 is a blue-emitting LED or laser diode, then the phosphor particles are chosen to convert blue light to yellow light. In this case, a single type of phosphor can be utilized. If semiconductor chip 12 is a UV-emitting LED or laser diode, the phosphor particles must generate both the blue and the yellow light. This can be accomplished by utilizing two types of phosphor particles, one containing the blue generating phosphor and one containing the yellow generating phosphor. Alternatively, each of the phosphor particles can include both phosphors, and hence, only one type of particle is needed.

In the preferred embodiment of the present invention, the mean diameter, $d_{50}$, of the phosphor particles have sizes in the range of 1 µm to 20 µm, with a $d_{90}$ particle size of less than or equal to 35 µm. The phosphor particles are uniformly dispersed in the epoxy medium. The suspension is then injected into the cup and the epoxy is cured by treatment with heat or UV light, depending on the particular epoxy formulation being utilized. Electrical connection is made to the top surface of chip 12 via wire 15, which connects to an electrical via 21. The second connection to chip 12 is made through the bottom of the chip. To simplify the drawing, this connection has been omitted. An optical dome 16 is placed over the encapsulated chip to control the manner in which the light is extracted.

The present invention utilizes "base" phosphors having a garnet structure in which the luminescent material satisfies the formula $Dy_3A_5O_{12}$, where A is at least one of the elements aluminum, gallium, or indium. Phosphors in which the Aluminum is replaced by equiatomic quantities of magnesium and silicon can also be utilized. These base phosphors are doped with different elements to provide phosphors with different emission bands. When more than one phosphor generated emission band is needed, the same base phosphor is preferably utilized with different doping agents. It should be noted that the aging of the phosphor is determined by the base phosphor, and not the dopant. Hence, the two phosphor devices do not exhibit the color shift with age described above, since the phosphors age at the same rate.

The preferred dopant for the yellow emission band is a cerium. The base phosphors can also be doped with Tb or Eu to provide emissions in different bands in the blue and red bands, respectively.

To provide a UV-activated light source, at least two phosphors must be utilized to generate a spectrum that is perceived to be white by an observer. As noted above, prior art devices that utilize a UV source utilize different base phosphors. The phosphors must be present in the correct relative proportions to provide a spectrum having the desired property. Unfortunately, the phosphors age over time at different rates. Hence, the relative proportion of the phosphors changes with time, leading to a color shift in the output spectrum over time.

The present invention avoids this shift. In the present invention, the two phosphors are created by utilizing different doping of the same base phosphor, i.e., $Dy_3A_5O_{12}$:X, where X is Ce, Tb, or Eu. Since the aging depends on the base phosphor, the different phosphors age at the same rate. Hence, the shift in spectrum discussed above is significantly reduced.

In the preferred embodiment of the present invention, $Dy_3Al_5O_{12}$ is utilized because this material provides high light fluxes and because aluminum is substantially cheaper than gallium or indium.

The manner in which a phosphor according to the present invention is synthesized will now be discussed in more detail with reference to the synthesis of $Dy_3A_5O_{12}$:$Ce^{2+}$. The preferred starting compound for A is an oxide of the element chosen. If A is aluminum, $Al_2O_3$ is utilized. The starting compound is mixed with $Dy_2O_3$ and $CeO_2$ in water to provide a starting mixture. The starting mixture is then manually blended or mixed in a suitable container such as a ball mill to form a starting powder mixture. Typically, a flux is added to the starting material to enhance the reaction at lower temperatures. After the slurry is blended in the ball mill, the slurry is baked or dried at ~120° C. to remove the excess water. The resultant cake is milled further, and the particle size of the starting materials is measured. The milling is continued until the particles size is in the range of one to two µm. This size range corresponds to an end product having a particle size of approximately 10 µm.

The milled powder is then fired in a carbon containing reducing atmosphere at 1200° C. to 1500° C. for several hours with the entire ramp up and down period lasting 2–3 days depending on the size of the furnace. The result is a crystalline phosphor powder and/or cake. The resultant material is then ground and milled to a powder, if necessary. The powder is then annealed or fired a second time in air at about 1300° C.–1500° C. The solid phosphor body may be converted to the phosphor powder by any crushing, milling or pulverizing method, such as wet milling, dry milling, jet milling or crushing. Preferably, the solid body is wet milled in propanol, ethanol, methanol and/or water, and subsequently dried.

It should be noted that a mixture of phosphors such as that discussed above with respect to UV activated light sources can be constructed by mixing the relevant dopants into the same batch of material. That is, the starting mixture discussed above can utilize a mixture of dopants oxides such as $CeO_2$, and $EuO_2$ in the same ratio as that desired in the final phosphor mixture. Hence, the mixture can be synthesized with essentially the same level of effort as that required to synthesize a single phosphor.

The preferred encapsulant discussed above is an epoxy; however, other encapsulants may be utilized without departing from the teachings of the present invention. For example, silicone, polyester, glass, acrylic and other transparent potting material may be utilized.

The above-described embodiments of a light source according to the present invention have utilized a cup in a printed circuit board to hold the light source and phosphor-containing layer. However, the present invention may also be practiced with other arrangements in which the light source is covered by the phosphor layer.

The above-described embodiments of the present invention have been described in terms of a white light source. However, the phosphors of the present invention can be utilized to generate light in any color range in which multiple phosphors are needed.

Various modifications to the present invention will become apparent to those skilled in the art from the foregoing description and accompanying drawings. Accordingly, the present invention is to be limited solely by the scope of the following claims.

What is claimed is:

1. A light source comprising:
   a semiconductor device emitting light in a first wavelength band;
   a layer comprising a phosphor comprising particles comprising $Dy_3A_5O_{12}$, where A is at least one of the elements aluminum, gallium, indium, magnesium or silicon, said layer being positioned to receive a portion of said light from said semiconductor device and convert said received light to light in a second wavelength band.

2. The light source of claim 1 wherein said semiconductor device comprises an LED.

3. The light source of claim 1 wherein said semiconductor device comprises a laser diode.

4. The light source of claim 1 wherein A comprises aluminum.

5. The light source of claim 1 wherein said particles are doped with Ce.

6. The light source of claim 1 wherein said particles are doped with Tb.

7. The light source of claim 1 wherein said particles are doped with Eu.

8. The light source of claim 1 wherein said particles are doped with two elements chosen from the group consisting of Ce, Tb, and Eu.

9. A light source comprising:
   a semiconductor device emitting light in a first wavelength band;
   a layer comprising a phosphor comprising particles comprising $Dy_3A_5O_{12}$, where A is at least one of the elements aluminum, gallium, indium, magnesium or silicon, said layer being positioned to receive a portion of said light from said semiconductor device and convert said received light to light in a second wavelength band,
   wherein A comprises equiatomic quantities of magnesium and silicon.

10. A phosphor comprising particles of $Dy_3A_5O_{12}$,
    wherein A comprises equiatomic quantities of magnesium and silicon.

11. A phosphor comprising particles of $Dy_3A_5O_{12}$, where A is at least one of the elements aluminum, gallium, indium, magnesium or silicon,
    wherein said phosphor is doped wit two elements chosen from the group consisting of Ce, Tb, and Eu.

12. A phosphor comprising $Dy_3A_5O_{12}$, where A is at least one of the elements gallium, indium, magnesium or silicon.

13. The phosphor of claim 12 wherein said phosphor is doped with Ce.

14. The phosphor of claim 12 wherein said phosphor is doped with Tb.

15. The phosphor of claim 12 wherein said phosphor is doped with Eu.

16. A phosphor comprising particles of $Dy_3A_5O_{12}$
    wherein A is equiatomic quantities of magnesium and silicon.

* * * * *